ROR PHOTOCURRENTS

United States Patent [19]
Kinameri et al.

[11] Patent Number: 4,791,288
[45] Date of Patent: Dec. 13, 1988

[54] SCANNING PHOTON MICROSCOPE FOR SIMULATANEOUSLY DISPLAYING BOTH THE AMPITUDE AND PHASE, DISTRIBUTIONS OF AC PHOTOVOLTAGE OR PHOTOCURRENTS

[75] Inventors: Kanji Kinameri; Chusuke Munakata, both of Nishitama, Japan

[73] Assignee: Hitachi, Ltd., Tokyo, Japan

[21] Appl. No.: 42,833

[22] Filed: Apr. 27, 1987

[30] Foreign Application Priority Data

Apr. 30, 1986 [JP] Japan .................................. 61-97931

[51] Int. Cl.$^4$ ............................................. H01J 37/28
[52] U.S. Cl. ...................................... 250/226; 358/107
[58] Field of Search ...................... 250/226, 310, 397; 356/402; 358/106, 96

[56] References Cited

U.S. PATENT DOCUMENTS

| 4,041,311 | 8/1977 | Martin | 250/310 |
| 4,560,872 | 12/1985 | Antonousky | 250/310 |
| 4,600,839 | 7/1986 | Ichihashi et al. | 250/397 |

Primary Examiner—Edward P. Westin
Assistant Examiner—Charles Wieland
Attorney, Agent, or Firm—Antonelli, Terry & Wands

[57] ABSTRACT

The scanning photon microscope according to this invention relates the phase of the ac photovoltage or photocurrent signal to the hue of a color image and the amplitude of the signal to the brightness of the image in representing the signal distribution in the specimen in the form of a color image, in order to make a clear distinction between the amplitude and phase of the ac photovoltage or photocurrent induced in the specimen when irradiated with a photon beam, thus permitting detailed and multilateral analysis of the specimen's characteristics.

2 Claims, 6 Drawing Sheets

SCANNING PHOTON MICROSCOPE FOR SIMULATANEOUSLY DISPLAYING BOTH THE AMPITUDE AND PHASE DISTRIBUTIONS OF AC PHOTOVOLTAGE OR PHOTOCURRENTS

BACKGROUND OF THE INVENTION

The present invention relates to a scanning photon microscope that enables observation of characteristic distribution of a specimen by sweeping a chopped light spot across the specimen such as semiconductors, by detecting an ac photovoltage or photocurrent generated in the specimen, and by displaying the two-dimensional distribution of the photovoltage in the form of black and white images. More specifically, this invention relates to an apparatus that permits multilateral analysis of the characteristics of the specimen by simultaneously displaying on a CRT (cathode ray tube) screen the amplitude and the phase of the specimen's ac photovoltage or photocurrent.

In performing non-destructive inspection on semiconductor wafers for their electrical characteristics, scanning photon microscopes utilizing the photoelectric effect have been used.

In such microscopes, the characteristic distribution of semiconductor wafers is examined in a way as described in say Japanese Patent Application Laid-Open No. 155543/1981. That is, an ac photovoltage generated in the semiconductor wafer specimen by the chopped photon beam sweeping across the specimen is detected and the voltage distribution is displayed on the CRT screen as a black and white image.

One example of the operating principle of the scanning photon microscope that precedes this invention and uses the aforementioned conventional technique is shown in FIG. 2.

In FIG. 2, a photon beam from the light source 1 such as laser is modulated in intensity by optical modulator 2 according to ac signals from oscillator 7. The modulated beam is passed through a photon beam deflector 3 into a lens 4 which focuses the beam onto a specimen 5. As a result, the specimen 5 such as semiconductor wafers with a junction produces within it an ac photocurrent by the photoelectric effect and induces an ac photovoltage which is a product of the photocurrent and the junction impedance.

The induced ac photocurrent or ac photovoltage is amplified by an ac amplifier 6 and supplied to synchronizing rectifiers 11 and 12. The synchronizing rectifier 11 performs synchronism rectification on the output of the amplifier 6 according to a reference signal from a phase shifter 9 that shifts the phase of the ac signal from the oscillator 7.

The phase shifter 10 produces another reference signal which is delayed 90° from the output signal of the phase shifter 9. On the basis of this reference signal, the synchronizing rectifier 12 performs synchronism rectification on the output of the amplifier 6. The outputs of the synchronizing rectifiers 11 and 12 are supplied to integrators 13 and 14 respectively which calculate the averages of the synchronization rectification results.

The above operation is further explained referring to the waveforms shown in FIGS. 3A to 3F. A waveform denoted 30 in FIG. 3A—which is the ac output signal from the oscillator 7—is phase-shifted by the phase shifter 9 to form a reference signal indicated by a waveform 31 of FIG. 3B. The reference signal 31 is then supplied to the phase shifter 10 that produces another reference signal 32 of FIG. 3C which is lagging the first reference signal by 90°.

Synchronizing rectification performed on the output of the amplifier 6, indicated by waveform 33 of FIG. 3D, according to the reference signals—waveforms 31 and 32—produces waveforms 34 and 35 of FIGS. 3E and 3F. Waveforms 36 and 37 represent the average values of the synchronizing rectification results, obtained by supplying these waveforms 34 and 35 to the integrators 13 and 14.

Now, turning to FIG. 2, a calculator 22 determines the amplitude of the output signal from the amplifier 6 by processing the outputs from the integrators 13 and 14. In more detail, the calculator performs the operation of $$A = \sqrt{X^2 + Y^2}$$

where A is an amplitude, X and Y are the outputs of the integrators 13 and 14 respectively. The calculator 22 feeds its operation result to a CRT driver 23 and further to a monochromatic CRT 24 where the amplitude of the signal is converted into the varying degrees of light spot brightness on the phosphor screen of the CRT 24.

The scanning movement of the light spot on the specimen 5 is controlled by the photon beam deflector 3 which is driven by a scan control circuit 8. The light spot on the phosphor screen of the CRT 24 is controlled, according to the signals from the scan control circuit 8, by a CRT deflector driver 19 and a deflecting coil 20 in synchronism with the sweeping timing of the light spot on the specimen 5.

As a result, the ac photovoltage distribution induced in the specimen 5 is displayed as a black and white image on the phosphor screen of the CRT 24 with the photovoltage magnitude reflecting electrical characteristics of the specimen, thus making it possible to estimate the electrical characteristics of the specimen. A circuitry made up of the ac amplifier 6, phase shifters 9 and 10, synchronizing rectifiers 11 and 12, and integrators 13 and 14 forms what is generally called a lock-in amplifier.

However, as the black and white image thus obtained has entirely lost information concerning the phase of the ac photovoltage or photocurrent produced in the specimen 5, it is difficult to identify the polarity of the junction in the specimen or estimate the condition of the depletion layer. One of the existing methods available to overcome this drawback is to eliminate, in FIG. 2, the phase shifter 10, synchronizing rectifier 12, integrator 14 and calculator 22. With this method, however, the brightness of the light spot on the phosphor screen of the CRT 24 is determined by both the amplitude and phase of the ac photovoltage or ac photocurrent generated in the specimen 5. This means it is difficult to distinguish between the amplitude and the phase from the displayed image.

In other words, the conventional technique, because of its inability to tell the amplitude from the phase of the ac photovoltage or ac photocurrent induced in the specimen 5, cannot offer detailed analysis on the characteristics of the specimen.

SUMMARY OF THE INVENTION

The objective of this invention is to provide an apparatus that can discriminate between the amplitude and the phase of the ac photovoltage or ac photocurrent induced in the specimen and thereby offer multilateral detailed analysis on the characteristics of a specimen.

To achieve this objective, the present invention so arranges the configuration of the apparatus as to represent the distribution of the ac photovoltage or ac photocurrent signals by a color image display with hue related to the phase of the ac photovoltage or photocurrent signal and brightness to the amplitude of the signal.

With this invention, the phase and amplitude of the ac photovoltage or photocurrent can clearly be distinguished from each other, making it possible to provide a scanning photon microscope that permits multilateral analysis of the specimen's characteristics.

DESCRIPTION OF THE PREFERRED EMBODIMENTS

Figure 1:
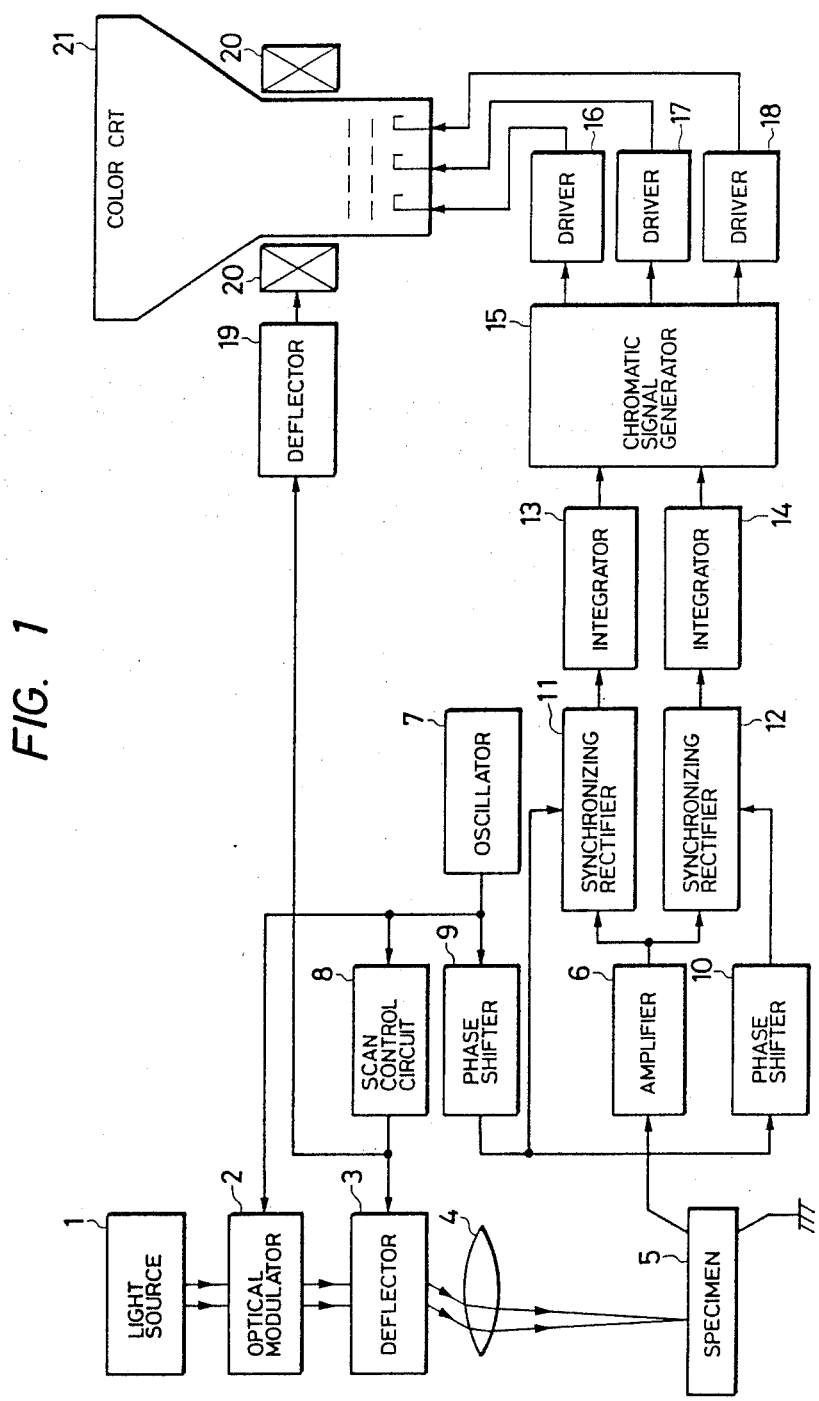
FIG. 1 is a basic configuration of the scanning photon microscope of this invention.
Figure 2:
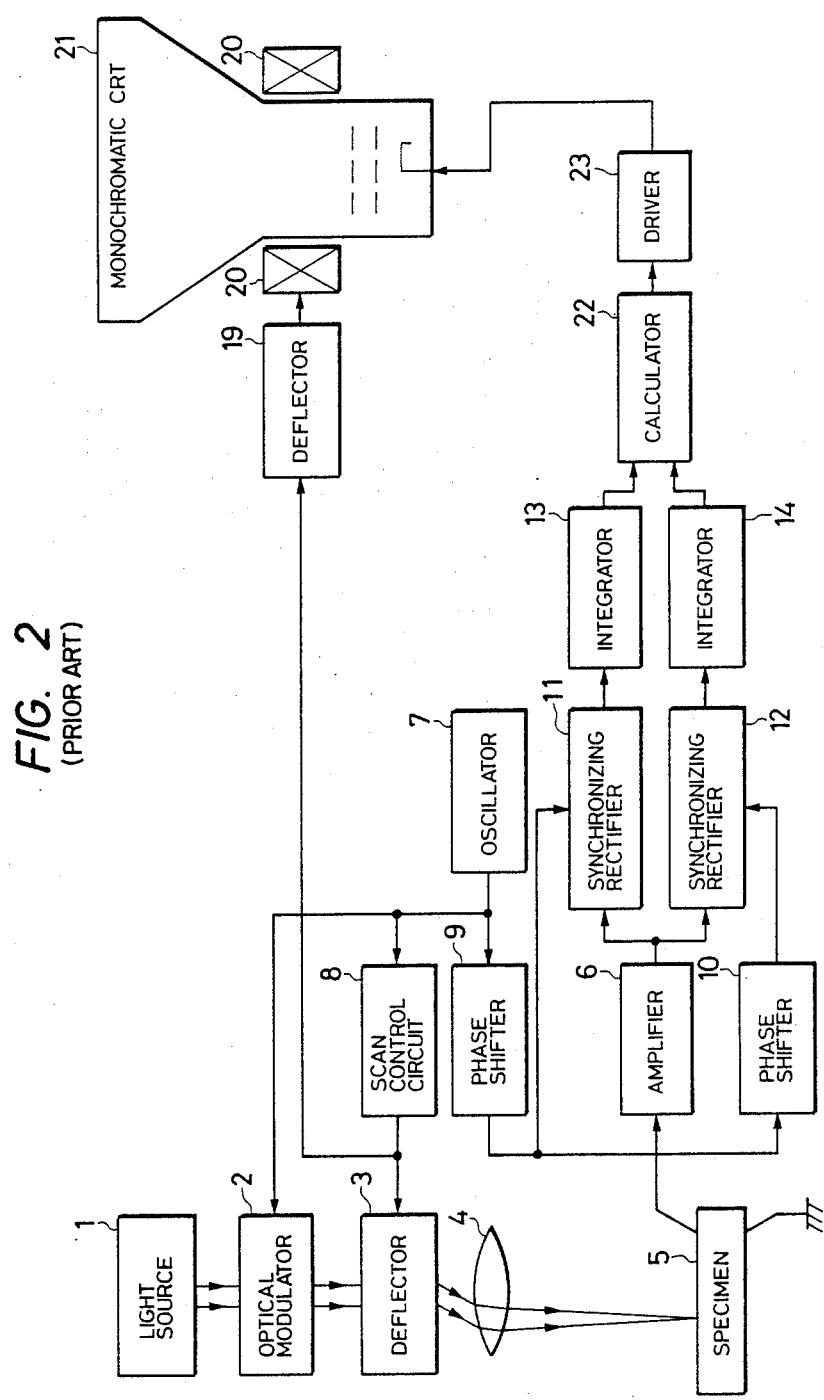
FIG. 2 is a basic configuration of the scanning photon microscope that precedes this invention.
Figure 3A:
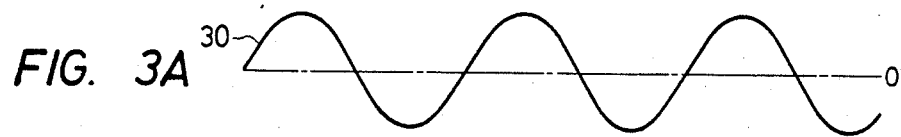
FIGS. 3A through 3F are signal waveform diagrams for the scanning photon microscope of FIG. 2.
Figure 3B:
Figure 3C:
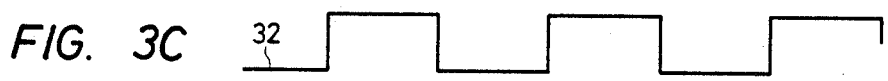
Figure 3D:
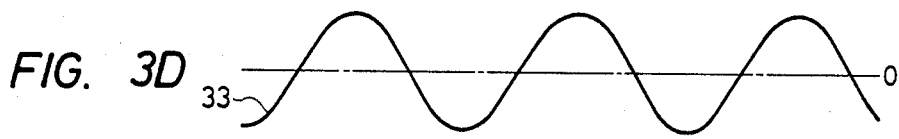
Figure 3E:
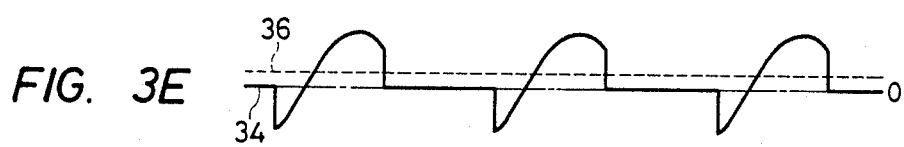
Figure 3F:
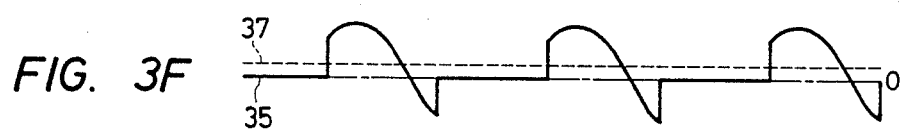

FIG. 1 shows a fundamental configuration of the scanning photon microscope according to this invention. Referring to FIG. 1, the points in which the apparatus of this invention differs from the existing apparatus of the prior art as shown in FIG. 2 are a color CRT 21 replacing the monochromatic CRT used in the prior art, a chromatic signal generator 15 replacing the calculator 22, and color CRT drivers 16, 17, 18 replacing the monochromatic CRT driver 23. The color CRT drivers 16, 17, 18 individually illuminate the primary colors, red, green and blue, of the color CRT 21.

The chromatic signal generator 15 converts the signals from the integrators 13 and 14 into chromatic signals and supplies them to the color CRT drivers 16, 17, 18. The chromatic signals produce a color image on the color CRT with the hue of the image corresponding to the phase of the output sigal from the amplifier 6 and its brightness to the amplitude of the output signal.

Figure 4:
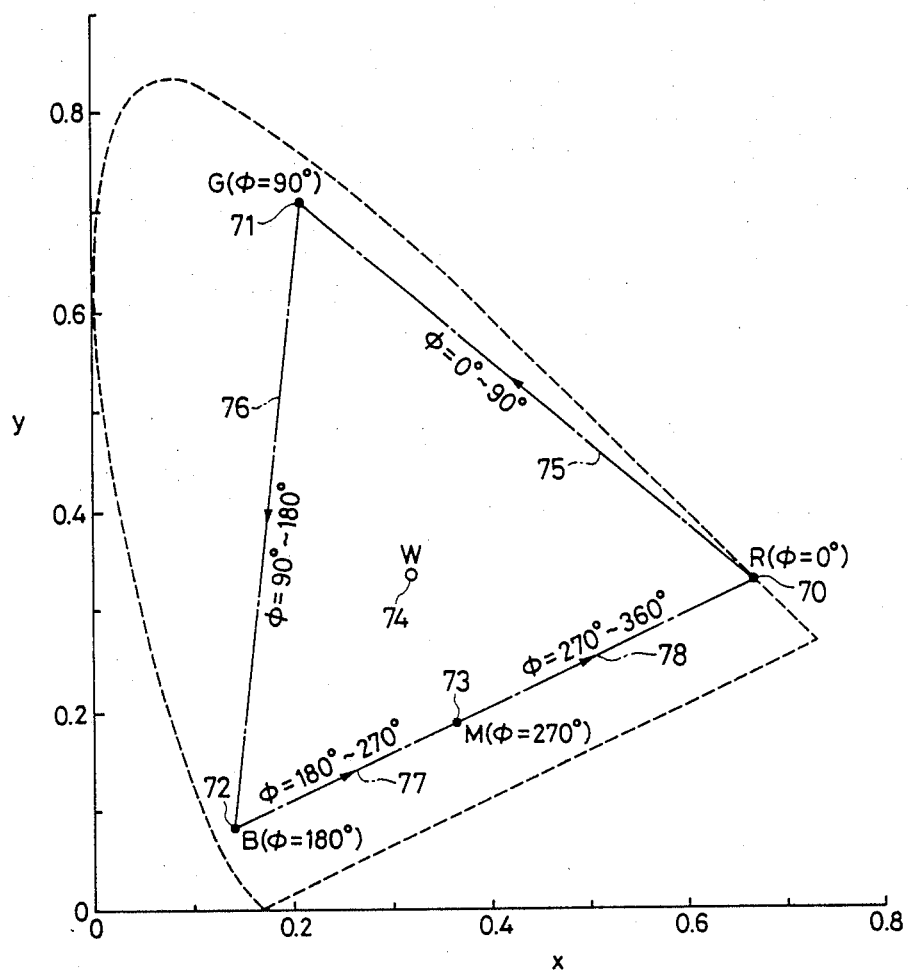
FIG. 4 is a CIE-xy chromaticity diagram showing the function of a chromatic signal generator employed in the scanning photon microscope of this invention.

The action of the chromatic signal generator 15 of FIG. 1 is described in the following by referring to the chromaticity diagram shown in FIG. 4.

The phase of the output signal of the amplifier 6 is related to the hue of the color image displayed on the color CRT 21 by phase difference $\phi$ between the output signal of the amplifier 6 and the reference signal produced by the phase shifter 9. For example, when the phase difference $\phi=0°$, the hue is represented by a red primary 70; when $\phi=90°$, it is represented by a green primary 71; when $\phi=180°$, it is represented by a blue primary 72; and when $\phi=270°$, it is represented by magenta 73.

In other words, since the output X of the integrator 13 and the output Y of the integrator 14 are expressed as $X=A \cos \phi$ and $Y=A \sin \phi$, the red primary is used when $X>0$ and $Y=0$; the green primary is used when $x=0$ and $Y>0$; the blue primary is used when $X>0$ and $Y=0$; and magenta is used when $X=0$ and $Y<0$.

When the phase difference is intermediate between these four cases, that is, when X and Y are both other than zero, the mixture of the associated two primary colors are used. When, for instance, $\phi$ is between 0° and 90°, the hue of the color image is given by the mixture of the red primary 70 and green primary 71. According to the color theory, the resultant chromaticity of the color mixture exists, in the xy chromaticity diagram of CIE (International Commission on Illumination) of FIG. 4, on the line 75 connecting the red primary point 70 and the green primary point 71.

The ratio of mixture between the red and green primaries is made variable according to the phase difference. When $\phi$ changes from 0° through 90°, the displayed color is changed gradually from red, orange, yellow and yellowish-green and to green. Likewise, when $\phi$ is between 90° and 180°, between 180° and 270°, and between 270° and 360°, the displayed color is made to gradually change according to the line 76, line 77 and line 78 respectively.

As to the brightness of the light spot on the color CRT 21 with the above hue, the chromatic signals are given to the CRT drivers 16, 17, 18 to make the brightness proportional to the amplitude A of the output signal of the amplifier 6.

Because of the action explained above, the color CRT 21 produces a color image whose hue corresponds to the phase of the output signal of the amplifier 6, i.e., the phase of the ac photovoltage or ac photocurrent signal induced in the specimen 5 and whose brightness corresponds to the amplitude of the signal, thereby permitting detailed analysis of electrical characteristics of the specimen in terms of amplitude and phase.

Figure 5:
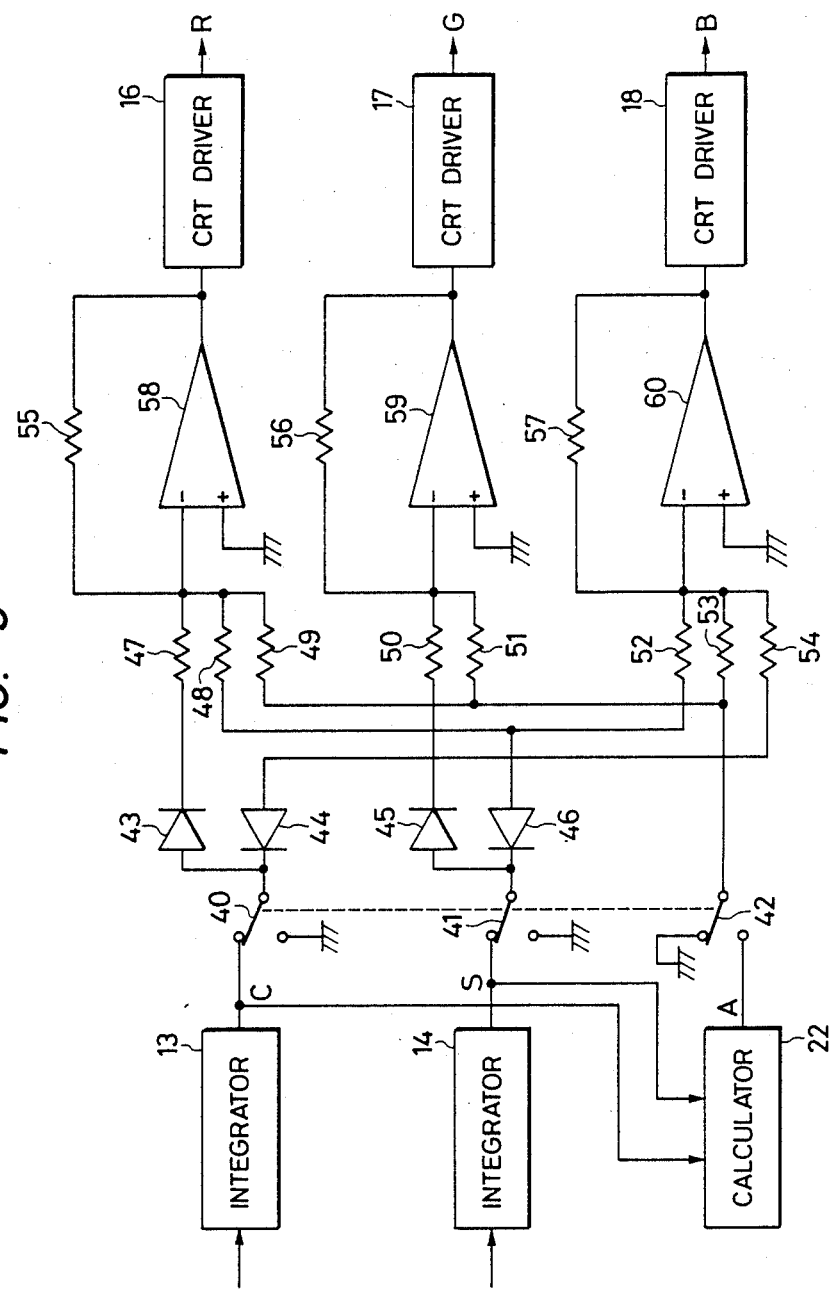
FIG. 5 is a circuit diagram showing one embodiment of the chromatic signal generator employed in the scanning photon microscope of this invention.

FIG. 5 shows one embodiment of the chromatic signal generator 15 of FIG. 1. In FIG. 5, a signal from the integrator 13 is supplied through a selection switch 40 to a forward diode 43 and a backward diode 44. The signal from the forward diode 43 is given to an operational amplifier 58 through a resistor 47; and the signal from the backward diode 44 is given to an operational amplifier 60 through a resistor 54. Similarly, the signal from the integrator 14 is given to a forward diode 45 and a backward diode 46 through a selection switch 41. The signal from the diode 45 is further supplied to an operational amplifier 59 through a resistor 50; and the signal from the diode 46 is fed to the operational amplifiers 58 and 60 through resistors 48 and 52 respectively.

The calculator 22, as explained in FIG. 2, determines the amplitude of the ac photovoltage or ac photocurrent from the output signals of the integrators 13 and 14. The output of the calculator or 22 is supplied to a selection switch 42 and further through resistors 49, 51, 53 to the operational amplifiers 58, 59, 60.

The operational amplifier 58 and resistors 47, 48, 49, 55 form an adder that adds up signals from diode 43, diode 46 and selection switch 42 and gives its output to the CRT driver 16 for red primary. Likewise, the operational amplifier 59 and resistors 50, 51, 56 form an adder that adds up signals from the diodes 45 and selector switch 42 and gives its output to the CRT driver 17 for green primary. The operational amplifier 60 and resistors 52, 53, 54, 57 also form an adder to add signals from the diode 46, diode 44 and selection switch 42 and to supply its output to the CRT driver 18 for blue primary.

The selection switches 40, 41, 42 are linked with each other and, in the condition shown in FIG. 5, the outputs of the integrators 13 and 14 pass through the selection switches 40 and 41 while the output of the calculator 22 is blocked by the switch 42. The operation in this condition is explained in the following.

The output X of the integrator 13 and the output Y of the integrator 14 are expressed as: $X = A\cos\phi$ and $Y = A\sin\phi$ where A is the output signal of the amplifier 6 of FIG. 6 and $\phi$ is the phase difference between the output signal of the amplifier 6 and the reference signal from the phase shifter 9. When $\phi = 0°$ in other words $X > 0$ and $Y = 0$, the action of the diodes 43 and 44 in FIG. 5 produces a signal at only the output of the operational amplifier 58. This means that only the CRT driver 16 for red primary is given a signal, so that on the color CRT 21 the light spot is displayed in red primary with brightness corresponding to the amplitude A.

Similarly, when $\phi = 90°$, or $X = 0$ and $Y > 0$, the light spot is displayed in green primary; when $\phi = 180°$, or $X < 0$ and $Y = 0$, it is displayed in blue primary; when $\phi = 270°$, or $X = 0$ and $Y < 0$, a signal appears at the output of the operational amplifiers 58 and 60 in FIG. 5, activating the red primary CRT driver 16 and blue primary CRT driver 18 with the result that the light spot is displayed in magenta.

When the phase difference is in between, that is when both X and Y are other than zero, the signal appears at the outputs of the two of the operational amplifiers 58, 59, 60. This causes the light spot to be displayed in the mixture of the associated two primaries, as explained earlier referring to the chromaticity diagram of FIG. 4.

In this way, the color CRT 21 produces a color image with its hue corresponding to the phase of the output signal of the amplifier 6, i.e., the phase of the ac photovoltage or ac photocurrent induced in the specimen 5 and with the brightness corresponding to the amplitude of the signal, making it possible to perform multilateral analysis on the electric characteristics of the specimen.

When the connection of the selection switches 40, 41, 42 is reversed, only the output of the calculator 22 passes through the selection switch 42 entering the operational amplifiers 58, 59, 60 with the result that a black and white image is displayed on the color CRT 21 corresponding to the amplitude distribution of the ac photovoltage and ac photocurrent.

Figure 6:
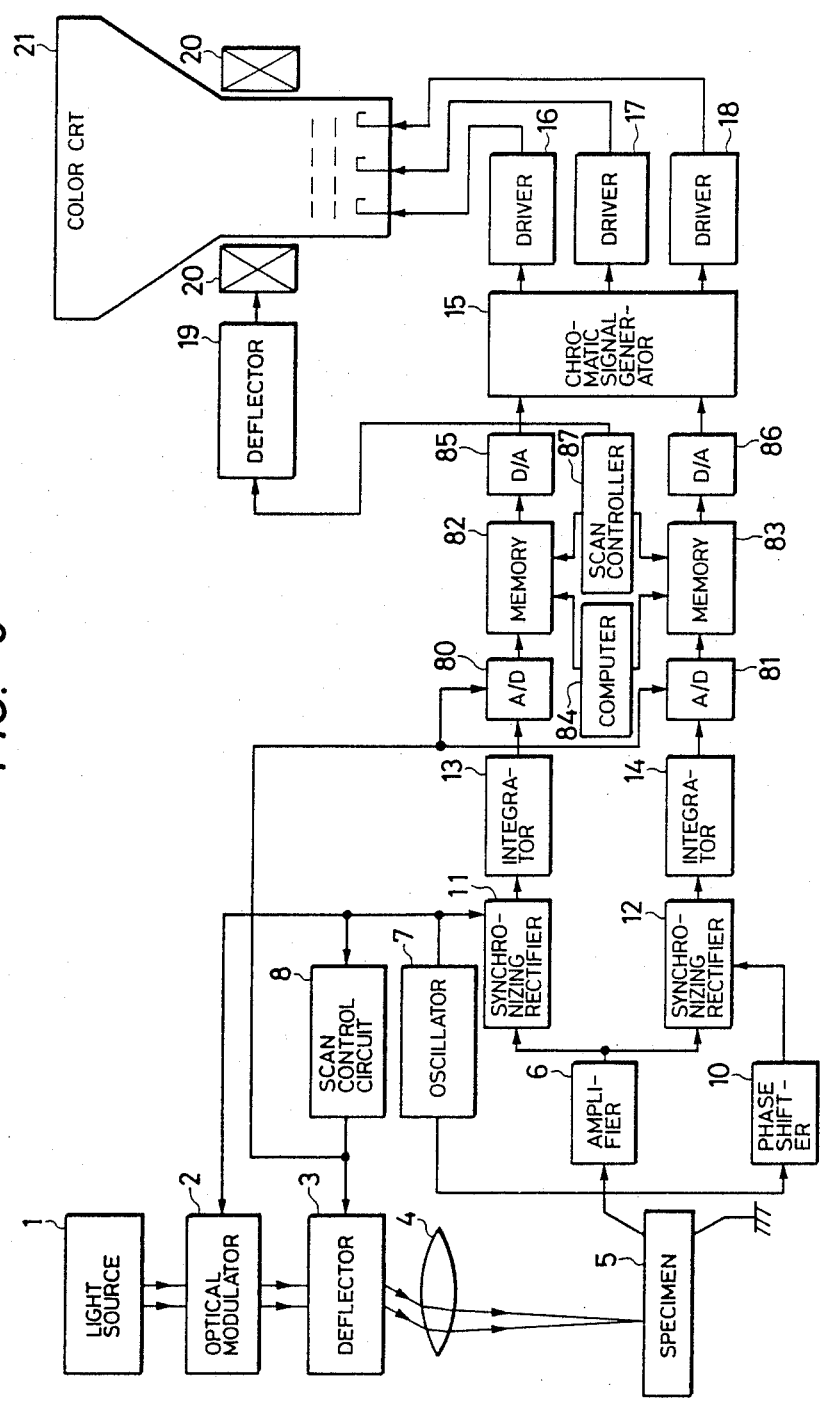
FIG. 6 is a circuit diagram showing another embodiment of the scanning photon microscope of this invention.

Now, let us turn to FIG. 6 which shows one embodiment of the scanning photon microscope of this invention. The configuration of FIG. 6 has a digital signal processing added to the configuration of FIG. 1. The outputs of the integrators 13 and 14 are converted into digital data by analog-to-digital converters 80 and 81 according to clock signals from the scan control circuit 8. The digital data thus obtained are stored in image memories 82 and 83. The digital data stored in the image memories 82 and 83 are read out by the scan signal from the scan controller 87 and are converted back into analog signals by digital-to-analog converters 85 and 86 and supplied to the chromatic signal generator 15. The light spot scanning on the color CRT 21 is accomplished by giving the scan signal from the scan controller 87 to the CRT deflector driver 19.

With the aforementioned configuration, it is possible to display the black and white image of the ac photovoltage or ac photocurrent distribution in the specimen 5 as a static image. Furthermore, in this embodiment, the contents of the image memories 82 and 83 can be rewritten arbitrarily by a computer 84. The data in the memories are replaced with new data that are obtained by performing the conversion defined by the following expression in which X and Y represents the contents of the integrators 13 and 14 stored in the image memories 82 and 83 and $\theta$ a modifiable constant.

$$\begin{bmatrix} X' \\ Y' \end{bmatrix} = \begin{bmatrix} \cos\theta & \sin\theta \\ -\sin\theta & \cos\theta \end{bmatrix} \begin{bmatrix} X \\ Y \end{bmatrix}$$

The above expression is identical to $$X' = A\cos(\phi - \theta)$$

$$Y' = A\sin(\phi - \theta)$$

In other words, by changing the reference phase, it is possible to display a modified image for the already acquired ac photovoltage or photocurrent distribution that was obtained by using an arbitrary reference signal. For example, setting $\theta$ such that the phase at any arbitrary point on the image is 0° makes it possible to clearly identify the relative phase difference between two points on the image on the CRT screen.

As described in the above, this invention offers a scanning photon microscope that permits a clear distinction between the phase and amplitude of the ac photovoltage or photocurrent and therefore multilateral analysis on the specimen's characteristics.

What is claimed is:

1. A scanning photon microscope comprising: a photon beam generator means that generates a photon beam; an ac signal generator means that generates an ac signal with a specified frequency; an optical modulator means that modulates the intensity of the photon beam according to the output signal from the ac signal generator means; a photon beam converging means that converges the photon beam modulated by the optical modulator means on the surface of the specimen; a photon beam scanning means that sweeps the photon beam converged by the photon beam converging means across the specimen surface; a photoelectric effect detector means that detects one of an ac photovoltage and photocurrent generated in the specimen when irradiated with the photon beam; an amplifier means that amplifies the one of the ac photovoltage and photocurrent detected by the photoelectric effect detector means; a reference signal generator that produces a reference signal with a specified phase difference from the output signal of the ac signal generator means; a phase shifter that produces a signal 90° out of phase with the reference signal; two synchronizing rectifiers that perform synchronizing rectification on the output signal of the amplifier means according to the reference signal and to the output signal of the phase shifter; two integrators that integrate the outputs of the two synchronizing rectifiers; a signal converter that combines and converts the two integrator output signals into three kinds of signals; and a color image displaying means that, according to the three kinds of signals from the signal converter, illuminates red, green and blue primaries and thereby displays a color image in synchronism with the photon beam scanning; whereby the signal converter processes the outputs of the two integrators in such a way that the hue and brightness of the image on the color image display means correspond, respectively, to the phase difference of the one of the ac photovoltage and photocurrent signal from the reference signal, and to the amplitude of the signal.

2. A scanning photon microscope as set forth in claim 1, further comprising: two analog-to-digital converters that convert the output signals of the two integrators into digital data; two groups of image memories that store the outputs of the two analog-to-digital converters in synchronism with the photon beam scanning; a computer that rewrites the image memories by performing operations on the contents of the image memories; a scan controller that produces timihg signals for reading out the contents of the image memories; and two digital-to-analog converters that, according to the timing signals from the scan controller, convert the digital signals read out from the image memories into analog data and supply the analog data to the signal converter; the computer being adapted to convert the contents of the image memories into image data which have phase information corresponding to the phase difference between the arbitrarily selected reference phase and the one of the ac photovoltage and ac photocurrent phase.

* * * * *